United States Patent
Ban

(10) Patent No.: US 9,021,185 B2
(45) Date of Patent: Apr. 28, 2015

(54) MEMORY CONTROLLER AND METHODS FOR ENHANCING WRITE PERFORMANCE OF A FLASH DEVICE

(75) Inventor: Amir Ban, Ramat Hasharon (IL)

(73) Assignee: Amir Ban, Ramat Hasharon (IL)

( * ) Notice: Subject to any disclaimer, the term of this patent is extended or adjusted under 35 U.S.C. 154(b) by 317 days.

(21) Appl. No.: 13/502,739

(22) PCT Filed: Nov. 23, 2010

(86) PCT No.: PCT/IB2010/055364
§ 371 (c)(1),
(2), (4) Date: Apr. 19, 2012

(87) PCT Pub. No.: WO2011/061724
PCT Pub. Date: May 26, 2011

(65) Prior Publication Data
US 2012/0221784 A1    Aug. 30, 2012

Related U.S. Application Data

(60) Provisional application No. 61/263,409, filed on Nov. 23, 2009.

(51) Int. Cl.
*G06F 12/00*  (2006.01)
*G06F 13/00*  (2006.01)
*G06F 13/28*  (2006.01)
(Continued)

(52) U.S. Cl.
CPC .... *G06F 12/0246* (2013.01); *G06F 2212/7207* (2013.01); *G11C 16/349* (2013.01); *G06F 2212/1016* (2013.01); *G06F 2212/1036* (2013.01); *G06F 2212/7202* (2013.01); *G06F 2212/7205* (2013.01)

(58) Field of Classification Search
CPC ................ G06F 12/0246; G06F 2212/7207; G11C 16/349
USPC ................................. 711/103, 154, 159–160
See application file for complete search history.

(56) References Cited

U.S. PATENT DOCUMENTS

| | | |
|---|---|---|
| 5,592,669 A | 1/1997 | Robinson et al. |
| 2007/0083697 A1 * | 4/2007 | Birrell et al. ................ 711/103 |
| 2008/0091901 A1 | 4/2008 | Bennett et al. |

(Continued)

OTHER PUBLICATIONS

Mendel Rosenblum and John K. Ousterhout "The design and implementation of a log-structured file system",ACM Transactions on computer systems, pp. 26-52, Feb. 1992.

(Continued)

*Primary Examiner* — Ryan Bertram
(74) *Attorney, Agent, or Firm* — Mark M. Friedman

(57) ABSTRACT

A memory controller and methods for managing efficient writing to a flash memory are presented. Fresh data is written to at least one block of the flash memory. During a space reclamation process, other data, previously written to the flash memory, is relocated to at least one other block of the flash memory, such that the fresh data and the relocated data always are maintained in separate blocks of the flash memory. During writing, an update frequency level is selected for the fresh data from among multiple update frequency levels and the fresh data is written to a block that is associated with the selected update frequency level. During space reclamation, a plurality of blocks, space of which is to be reclaimed, is selected and the valid pages thereof are copied to at least one destination block.

12 Claims, 9 Drawing Sheets

(51) Int. Cl.
 *G06F 12/02* (2006.01)
 *G11C 16/34* (2006.01)

(56) References Cited

U.S. PATENT DOCUMENTS

| | | |
|---|---|---|
| 2008/0307192 A1 | 12/2008 | Sinclair et al. |
| 2009/0113112 A1 | 4/2009 | Ye et al. |
| 2009/0157952 A1* | 6/2009 | Kim et al. ............ 711/103 |
| 2010/0082883 A1* | 4/2010 | Chen et al. ............ 711/103 |
| 2010/0095049 A1* | 4/2010 | Manning ............ 711/103 |
| 2010/0199021 A1* | 8/2010 | Harper et al. ............ 711/103 |
| 2011/0010489 A1* | 1/2011 | Yeh ............ 711/103 |

OTHER PUBLICATIONS

Michael Wu, Willy Zwaenepoel, "eNVy: A Non-Volatile, Main Memory Storage System" ACM SIGOPS Oerating Systems Review vol. 28, n0.5, Dec. 1994—pp. 86-97.

* cited by examiner

MEMORY CONTROLLER AND METHODS FOR ENHANCING WRITE PERFORMANCE OF A FLASH DEVICE

CROSS-REFERENCE TO RELATED APPLICATIONS

This application claims priority of U.S. Provisional Patent Application No. 61/263,409, filed on Nov. 23, 2009.

FIELD AND BACKGROUND OF THE INVENTION

The present invention relates to a memory controller and methods for enhancing write performance of a flash device and, more particularly, to a flash memory controller and methods for enhancing write performance by reducing write amplification of a flash memory device.

Many storage devices are based on flash memory: memory cards, USB flash keys and SSD's (solid-state disks) are examples of flash-based storage devices, also called flash disks. There are numerous advantages of flash disks over older magnetic disks: small size, light weight, low power consumption, fast access time and shock resistance are some of these advantages.

Flash memory is a type of electrically erasable programmable read-only memory (EEPROM). Flash memory cells are non-volatile, programmable, and may contain one or more bits of data. A flash memory has two main limitations: (i) cells may not be reprogrammed, except after erasing a large block of memory, and (ii) the memory can endure only a limited number of write and erase operations.

A NAND flash, the most common type of flash memory used for data storage is a page mode flash, in contrast to the older byte or word-mode NOR flash. The NAND flash's smallest addressable unit of memory is a page. Once addressed, individual bytes of the page are serially accessed on read, or serially loaded on write. Pages are not individually erasable and the smallest erasable unit of NAND flash memory is a block, which is much larger than a page. A typical size of a NAND flash page is 4 Kbytes (4224 bytes including 128 spare bytes), and a typical size of a NAND flash block is 256 KBytes or 512 KBytes, with 64 or 128 pages per block. A block is typically erased in 1.5 milliseconds. The time duration of a page write (including data serial download time) is typically 300 microseconds for 1-bit/cell flash and 900 microseconds for 2-bit/cell flash. Reading a page is significantly faster than writing.

In order to overcome flash limitations and provide flash devices with a disk-like interface, various data structures and algorithms have been described in the art. These have usually been implemented either as software that is part of a computer system, or more commonly, as part of a controller managing the flash device.

A comprehensive review of data structures and algorithms used for flash memories is given by Gal, E. and S. Toledo in the article "Algorithms and Data Structures for Flash Memories", ACM Computing Surveys, 37(2):138-163, 2005. A common design of such a system for NAND flash is log-structured management: pages written to the media are recorded as if to a log, to sequentially free page locations, in their order of arrival. An early description and performance analysis of such a system is given by Wu, M. and W. Zwaenepoel, in the article "enVy, A non-volatile main memory storage system", ACM SIGOPS Operating Systems Review vol. 28, no. 5, 86-97, December 1994, and also, though not in the context of flash memory, by Rosenblum, M. and J. K. Ousterhout, "The design and implementation of a log-structured file system", ACM Transactions on Computer Systems; 10(1):26-52, February 1992.

Though variations may exist, a log-structured controller typically implements the following: the controller at all times guarantees that some minimum number d>0 of blocks are erased and free. At any point in time, the write destination of fresh data is the free space on one particular block, and fresh pages are written to that destination sequentially, in whatever order they arrive. If the page of the same logical page number was previously written, the controller invalidates the page's previous content, wherever it was written, making that page location superseded. In order to manage the invalidation of previous written content, the controller maintains a map of the current physical page number (PPN) of every logical page number (LPN), and a map of the space of all physical pages, showing which physical pages contain valid data and which are superseded. When the block, which is the current write destination, has had all its pages written, the controller selects another free block as the write destination.

Before doing so, the controller checks whether the number of free blocks has fallen below the minimum of d blocks. If so, the controller performs space reclamation. The space reclamation process includes: (i) selecting a free block as a write destination block; (ii) selecting a non-free block that contains some superseded pages and some valid pages, as a source block; (iii) copying all valid pages of the source non-free block to free pages of the destination block. Pages containing superseded data are not moved; and (iv) erasing the source block and adding it to the free block pool. The net effect is that pages containing superseded data on the source block are gained as free pages on the destination block. After completing space reclamation, the controller sets the first free page on the write destination block to be the new fresh data destination.

The space reclamation procedure described above performs flash writes (and reads) that may be called parasitic, as they are not fulfilling a read or write request initiated by an application. This effect of additional writes forced by the need to maintain the flash media is a general and unavoidable feature of flash algorithms, and is called in the art 'write amplification'. If fresh data refers to data written to the flash by an application, then the write amplification is numerically defined as the ratio of the size of data actually written to the size of fresh data. An average write amplification of three, for example, means that for each fresh page of data, on average, three pages were actually written to the flash, two of which were written as part of the reclamation process. Write amplification of one is the minimum, and means no amplification. Write amplification is obviously detrimental to write performance. The effective performance of the flash device is cut by a factor equal to the average write amplification. For example, a flash device with a raw write rate of twelve megabytes per second, and a flash controller with write amplification of three, supports only four megabytes per second of application writes. Furthermore, write amplification is detrimental to the endurance of the flash device. Since the number of write/erase cycles of each flash block is limited, each write operation brings the device closer to ending its functional life. Therefore the lifetime of the flash device is effectively shortened by the write amplification factor. The space reclamation process determines the write amplification, and therefore the write performance of the media.

In order to demonstrate the write amplification effect, suppose the number of pages in a block is N, and the number of superseded pages in a block, selected to be freed by the space reclamation, is v. The number of page moves is therefore N-v, so that at the end of the copying, there remain v free pages in the write destination block, which may be used to write fresh data. The write amplification (which is defined as total number of writes divided by the writes performed by the reclamation process) is therefore N/v.

While ideally a block in which all pages are superseded can be found, in which case no parasitic page moves are necessary, this cannot be guaranteed. The best the controller can do, in the short-term, is to select the block with the smallest number of valid pages, in what may be called a greedy approach. The "greediness" of the algorithm must be tempered by conflicting wear-leveling and CPU load considerations. Long-term considerations may also justify deviating from a greedy approach, as this invention will demonstrate.

Flash data structures commonly define the formatted size of flash media to be less than the physical size of the flash devices which compose it, in what is called over-provisioning. Over-provisioning is the excess percentage of the formatted size available in physical flash space. For example, if flash devices of total size 64 GBytes are used to hold a media whose formatted size is 50 GBytes, over-provisioning is said to be 28% (64/50-1). There is a positive relation between over-provisioning and write performance in many flash algorithms, including log-structured ones. If the media is over provisioned by x (x is e.g., 100%), then the formatted media size is $1/(1+x)$ (in this example: ½) of the physical flash available, and at any point in time $x/(1+x)$ (e.g. 50%) of the pages in a block are superseded on average. Greedy space reclamation will therefore guarantee write amplification no worse than $(1+x)/x$ (e.g. 2). In practice, write amplification will be even lower (i.e. better), because the block with least valid pages will have fewer valid pages than the average.

It would be highly advantageous to have a flash memory controller that reduces write amplification, so as to improve write performance and prolong functional lifetime of a flash memory.

SUMMARY OF THE INVENTION

According to the present invention there is provided a memory controller and a method for managing writing to a flash memory, including: (i) writing fresh data to at least one block of the flash memory; and (ii) during a space reclamation process, relocating other data previously written to the flash memory, to at least one other block of the flash memory, as relocated data. The fresh data and the relocated data always are maintained in separate blocks of the flash memory.

Preferably, the fresh data is exclusively written to at least one block that was initially entirely free. The relocated data may also be written to at least one block that was initially free.

According to the present invention there is provided a memory controller and a method for storing fresh data in a flash memory, including: (i) selecting an update frequency level for the fresh data from among multiple update frequency levels; and (ii) writing the fresh data to a block that is associated with the selected update frequency level.

According to an embodiment of the invention, if a previous version of the fresh data was freshly written, then a hot update frequency level is selected and if a previous version of the fresh data was written during space reclamation, then a cold update frequency level is selected.

According to an embodiment of the invention, if a block associated with a previous version of the fresh data is indicated as a fresh block, then a hot update frequency level is selected and if a block associated with a previous version of the fresh data is indicated as a non-fresh block, then a cold update frequency level is selected.

Optionally, update information, indicative of an age of the fresh data, is written when the fresh data is written. The selection of the update frequency level may be based on the update information. The update information may include a page sequence number.

The selection of the update frequency level may be based on a difference between a global sequence number and the page sequence number.

According to the present invention there is provided a memory controller and a method for reclaiming space in a flash memory, including: (i) selecting a space reclamation mode from among a plurality of space reclamation modes; and (ii) selecting at least one block for reclaiming space thereof, based on the selected space reclamation mode.

The space reclamation modes may include an age mode and may further include a least-blocks mode.

The selecting of the space reclamation mode is according to respective predefined probabilities for selecting the space reclamation modes.

Preferably, a predefined probability for selecting the age mode is at least 10%.

If the age mode is selected, then the selected blocks are blocks that were least recently written with fresh data.

Optionally, if the age mode is selected, then the selected blocks are blocks that are associated with lowest sequence numbers among sequence numbers of all blocks in the flash memory.

If the least blocks mode is selected, then the selected blocks are blocks that include fewest valid pages comparing to a number of valid pages of other blocks of the flash memory.

According to the present invention there is provided a memory controller and a method for reclaiming space in a flash memory so as to increase a number of free blocks, including: (i) selecting a plurality of reclaimed blocks, wherein each of the reclaimed blocks includes at least one superseded page; (ii) selecting at least one destination block; (iii) copying valid pages from the reclaimed blocks to the at least one destination block; and (iv) erasing the reclaimed blocks. The selecting, the copying and the erasing are repeated until the number of free blocks is increased by at least one block.

According to the present invention there is provided a memory controller and a method for reclaiming space in a flash memory, including: (i) selecting, for reclaiming space thereof, a block that includes at least one superseded page and that was not freshly written during a time period that is longer than an inactivity duration threshold; (ii) copying any valid pages of the selected block to at least one other block; and (iii) erasing the selected block.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

Figure 1:
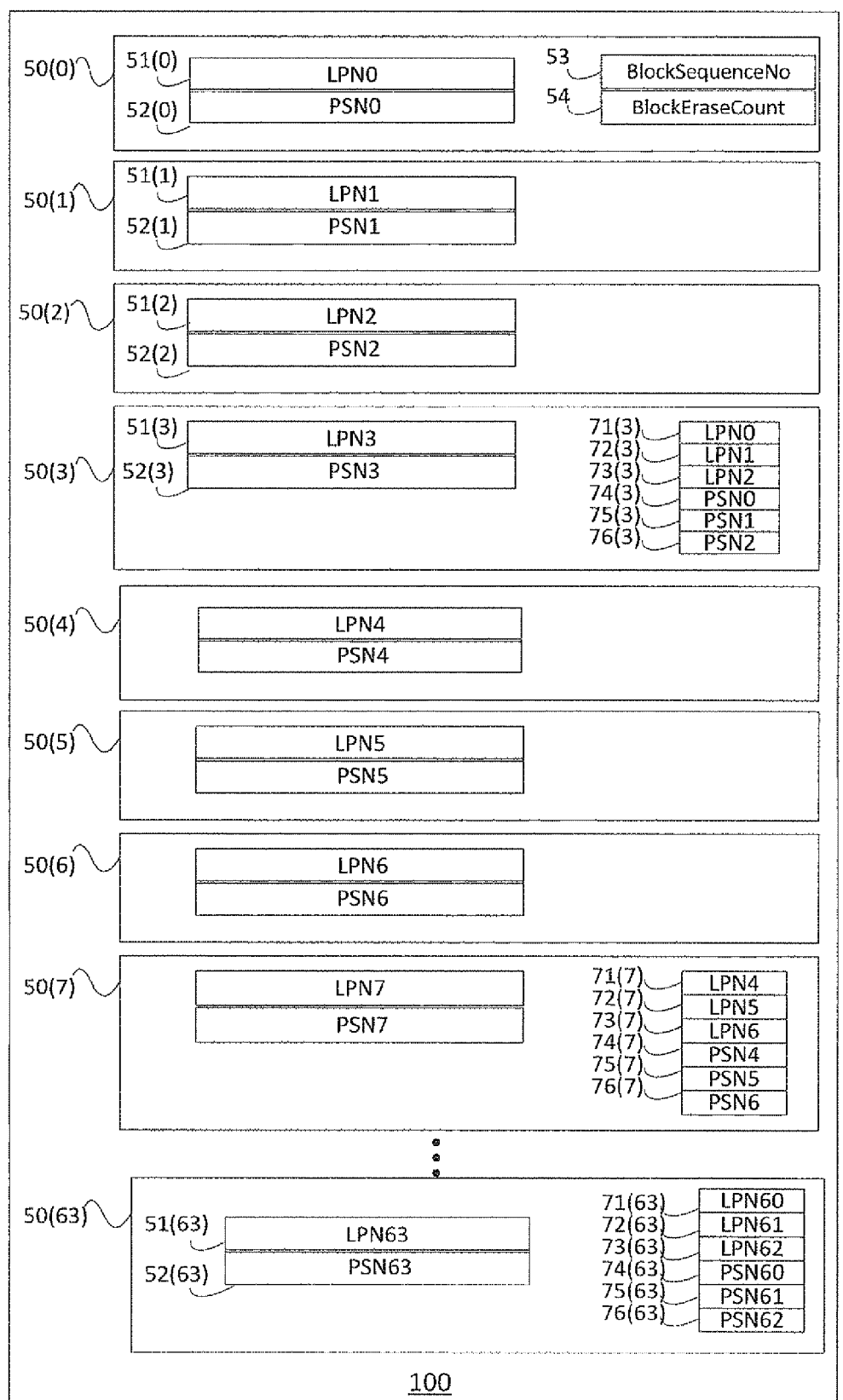
FIG. 1 is a block diagram, illustrating control information, stored in pages of a flash memory, according to an embodiment of the invention.

The principles and operation of a flash memory controller and methods for memory management of a flash device, according to the present invention may be better understood with reference to the drawings and the accompanying description.

In the context of the present invention, the term superseded page refers to an obsolete physical page, for which a newer content of an associated logical page thereof was rewritten to another physical page.

The term valid page hereinafter refers to a physical page that contains the most recent version of the associated logical page (older versions of the logical page resides in superseded pages).

The term space reclamation hereinafter refers to a process that copies non contiguous valid pages from multiple blocks to physical pages in at least one free block. The non-contiguousness of pages in the former block is caused due to superseded pages caught among valid pages. The number of total copied pages is at least the maximum pages per block, so as to gain at least one free block.

The terms relocated pages, moved pages or copied pages refer to valid pages that were copied by the space reclamation process.

The term fresh data hereinafter refers to data that was written by an application, in contrast to that was written, unsolicitedly, by the space reclamation process.

The term fresh page hereinafter refers to a physical page that contains fresh data.

The term fresh block hereinafter refers to a block that contains only fresh pages, as opposed to a non fresh block that contains relocated pages.

The term free block hereinafter refers to an erased block that is ready for sequential writing, starting from its first page.

The term flash memory or flash device hereinafter refers to any type of flash memory or device but may be substitutable with any other memory device that uses non volatile storage and can be electrically erased and reprogrammed, and wherein the basic erasable unit is substantially larger than the basic writable units.

The present invention provides an improved writing management to a flash device that reduces write amplification and thereby writing to the flash device of the invention is faster than writing to a flash device of prior art. Furthermore, the functional lifetime of the flash device of the invention is longer than the functional lifetime of flash devices of prior art as a consequence of the reduced write amplification. The methods described herein are variations of the general log-structured algorithm, and differ from the general algorithm in the criteria used to select blocks for space reclamation, in the space reclamation procedure itself, as well as the number of concurrent write streams to the media.

Different parts of a memory medium differ by the frequency in which they are modified: some parts of the medium are frequently updated, and are referred to as hot parts. Other parts are seldom updated, and are referred to as cold parts. Extremely cold parts are static: once written, they are never, or very seldom changed. This variation is a result of usage patterns of the media storage, its users and the applications that utilize the medium. The usage pattern itself may slowly change over time, as when an area that was relatively unused becomes busy through the deployment of a new database, and another formerly busy area falls into disuse through the retirement of an application. The present invention utilizes the variation in the write frequency of pages in the medium so as to improve performance. No outside information about the variation is needed, changes in usage pattern of the media are automatically detected. When changes of usage pattern are detected, the memory controller responds and adapts to the change quickly and efficiently.

The methods used by the memory controller keep all pages within a block, such that they have a similar update frequency, e.g. hot pages share the same block with other hot pages, while cold pages share the same block with other cold pages. To demonstrate the contribution of this rule, consider a situation where 50% of the flash memory is static (never updated), and the static pages are evenly distributed throughout the blocks. If a block contains, e.g., 64 pages, then on average, 32 pages are static and never updated. Therefore the static pages remain valid and must be moved during space reclamation, increasing write amplification. If, for example, a block that was selected for space reclamation, contains 39 valid pages (the other 25 pages are superseded), then statistically, 32 of these valid pages are static and the rest, only 7 pages are not static. If all the pages within the selected block would have been hot pages (rather than only 50% of the 64 pages), then the other half of the block that contains 32 pages that are also hot, would statistically provide another 7 valid pages, so that the expected number of valid pages, rather than 39, would have been 14. The write amplification will be decreased in the same proportion: rather than 64/(64−39)=2.56, would be about 64/(64−14)=1.28. Typically, most superseded pages are of logical pages that have the highest rewrite frequency, thus, having an ability of selecting, by the space reclamation process, a block which all pages are hot or have essentially the same write frequency, improves the write amplification.

Unused space is ideally concentrated in the busiest blocks and must not become "stuck" in blocks that are seldom reorganized. The reason for this is that over-provisioning reduces write amplification: the more unused space on the flash device, the lower the write amplification, as the unused space appears to the space reclamation process as superseded pages that need not be moved. Superseded pages in blocks that are never or seldom reorganized are effectively lost to a space reclamation algorithm, and the unused space "stuck" in static blocks is effectively subtracted from the over-provisioned amount.

For this reason, it would be beneficial to prevent sticking of unused space in static blocks and to free unused pages to the common pool, where these pages may play a positive role in lowering write amplification.

The goal of the present invention is to overcome the two undesired situations described above: (i) avoid having, by the space reclamation process, a block that contains pages with different update frequency characteristics (cold and hot pages mixture); and (ii) prevent sticking of unused pages in static blocks.

The following section will describe a solution for avoiding the two undesired situations described above.

Separation of Fresh Data

Only blocks that are completely free (or alternatively, contain only fresh pages) are assigned for writing fresh pages. This is in contrast to the prior art algorithm, where a block may be partially written by pages moved by the space reclamation process, and its remaining pages get written by fresh data. As a result of the prior art algorithm, old data is mixed with fresh data in the same block. According to the present invention, fresh pages fills entire blocks.

Multi-Block Space Reclamation

In contrast to the prior art space reclamation algorithm, which reclaims the space of a single block at a time, the space reclamation of the present invention reclaims space of several blocks at a time, so as to reorganize the valid pages of n blocks into at most n−1 blocks, so that at least one block becomes completely free. It should be noted that in the extreme case, this multi block space reclamation may need to handle a substantial amount of blocks. For example, if each block includes 64 pages, and no block has more than one superseded page, the space reclamation will reorganize 64 blocks, writing their valid pages into 63 blocks, with one block left free.

Dual Mode Space Reclamation

The criteria used to select blocks that participate in space reclamation may vary. At times it uses a greedy approach, in which the block with the largest number of unused (superseded) pages is included first, then the block with the second largest number of unused pages, and so on, until the total number of unused pages is at least the number of pages in a block. At other times blocks are selected according to different criteria.

The space reclamation works in one of two modes: (i) Least-blocks mode: the space reclamation attempts to include as few blocks as possible in the reorganization, using greedy selection as described above, or similar; and (ii) Age mode: the space reclamation selects blocks based on the age of their page data. Typically this means selecting the block which was least recently erased (but still contains at least one superseded page).

The space reclamation procedure divides its time between the two modes: in most cases the space reclamation operates in the least-blocks mode, but occasionally operates in the age mode. The decision of which mode to adopt may be randomized, based on a random number generator which is tuned to select each mode according to a given frequency percentage. The Applicant has found that the best results are obtained when space reclamation operates 10%-20% of the time in age mode, with the remaining 80%-90% of the time in least-blocks mode.

Frequency Segregation

The write method of the present invention a priori separates fresh pages into multiple update frequency categories by making inferences on each page's update frequency. A stream of fresh pages is segregated into several streams differentiated by estimated update frequency, with each such stream having its own destination block for writing. A determination of a page's age requires recording and maintenance of the time of writing to the page (or equivalently, of a sequence number attached to the page during writing). Alternatively or additionally, the write method allows a segregation into two streams by differentiating between fresh pages written to fresh blocks and relocated pages written by the space reclamation process.

The following arguments are set forth so as to explain how the fresh and non-fresh block separation works towards an implementation of the above guidelines. Given the update frequency of all pages of the media, in a long string of contiguous page writings, there exists an expected proportion of hot and cold pages as well as of intermediate shades of page "temperature". i.e. there is an expected distribution of pages by frequency in a sequence of page writings. This frequency is herein referred to as a fresh distribution. Consider a block whose pages have freshly been written by an application. At the time of writing, the block's pages are samples of the fresh distribution. As time passes, these pages are rewritten in other blocks, and their older versions that reside in the block becomes superseded pages. Hot pages are, by definition, superseded at a higher rate than cold pages. Therefore the distribution of pages in the block is skewed from the fresh distribution towards the "cold" direction. The longer the time passed since writing, the more pages are superseded, and the more the distribution of the remaining valid pages is skewed to the cold direction and ultimately, only static pages will remain. Therefore, blocks grow colder, (i.e., cold pages become more predominant among valid pages) than the fresh distribution, as time passes, and the more time goes by, the colder the block becomes. Also, the more time goes by, the number of valid pages decreases. Therefore, a "greedy" space reclamation algorithm that selects the block with the smallest number of valid pages, is likely to select a cold block, i.e., a block whose remaining valid pages are significantly colder than the average. Pages moved during space reclamation are therefore likely to be cold, and significantly colder than the fresh distribution. In the prior art log-structured algorithm, after pages are moved to a new block, the remaining free pages of that block will become written by fresh data, resulting in the cold distribution of the moved pages becoming mixed with the hotter fresh distribution. As was described above for the space reclamation process, such mixing should be avoided so as to reduce the number of page moves.

The space reclamation of the present invention reorganizes cold blocks among themselves, and fresh data is written exclusively to free blocks (or to fresh blocks). No mixing of cold moved data with hotter fresh data ever takes place. In fact, blocks may be divided into two kinds: (i) blocks originally written with fresh data that did not yet experience space reclamation; and (ii) blocks with pages that were moved by space reclamation. The first kind of blocks are relatively hot, recently written blocks having the fresh distribution as well as less recently written blocks, having a colder distribution. The second kind of blocks are typically coldest. The coldest pages of the flash media, including static pages, therefore get naturally segregated into cold blocks, while hotter blocks contain few or no cold pages. This is a primary aim of the algorithm, whose beneficial effect on write amplification was already noted: most of the activity takes place on the hot blocks, which, as they contain few or no cold pages, have more superseded pages, and fewer valid pages need to be relocated by space reclamation.

Data structures used by the memory controller for memory management are divided into data structures recorded to the flash memory, which is non-volatile, and data structures built and maintained in a controller's memory during the operation of the flash device, which are volatile and are initialized during power on.

Each NAND page contains 4 KBytes of main area, used to write the actual page data, and 128 bytes of spare area. Part of the spare area is used for device or flash specific data such as ECC (error-correcting code) checksums. The rest of the spare area is used for storing non-volatile control information.

The system maintains a global sequence number (GSN) which is an I/O activity counter that is incremented before every update operation. The GSN is then assigned to a page being written or to a block being erased. This sequence stamp allows dating the update operation, i.e., determining the order in which events happened, and how far back (in terms of I/O activity) they occurred. Whenever a block is erased, and before page data is written or moved to it, the GSN is incremented and assigned to the block as a block's sequence number. The block sequence number enables determining the order in which page data was written to the flash media. Page data with lower block sequence number was written before page data with higher block sequence number. If pages are written in the same block, the physical page order determines their order of writing. Furthermore, the age of the data can be measured by the difference between the GSN and the block sequence number.

Referring now to the drawings, FIG. 1 illustrates non-volatile control information associated with each page and collectively denoted 50, stored in the spare area of each page in a block 100. Each control information 50, includes a logical page number, collectively denoted 51, that serves as an entry index to a logical page table 300 of FIG. 3. Each control information 50 further includes an optional page sequence number, collectively denoted 52 that is derived from the global sequence number (GSN) when the page data is freshly written (rather than copied during space reclamation).

For example: control information 50(0) is a data structure stored in the spare area of a first physical page of block 100 and includes a logical page number (LPN0) 51(0) associated with the first physical page and, optionally, a page sequence number (PSN0) 52(0) which is a value that the global sequence number contained at the time of the writing of the first physical page of block 100. Other examples: control information 50(1) contains a data structure for the second physical page in block 100 and includes: a logical page number (LPN1) 51(1) associated with the second physical page and, optionally, a page sequence number (PSN0) 52(1) which is the value that the global sequence number contained at the time of the writing of the second physical page. Similarly, a last page in block 100, in this case the 63$^{rd}$ page has a control information 50(63) that contains a data structure for the last physical page in block 100 and includes: a logical page number (LPN63) 51(63) associated with the last physical page and, optionally, a page sequence number (PSN63) 52(63).

The control information of the first page in every block contains information of the block. In this example, control information 50(0) contains the following details of the block: a block sequence number 53 and a block erase count 54. Block sequence number 53 is derived from the global sequence number (GSN) and is assigned to the block after erasure and before any data is written to it. The block sequence number allows a determination of which page data has been more recently written (in case the page sequence number is not implemented). The essential difference between block sequence number 53 and page sequence number 52 is that the latter is copied with the page data when the page is moved, and therefore enables determining the age of the data since being freshly written, while the former only enables determining the age of the data since being most recently moved or written.

Optionally, every k$^{th}$ control information includes the control information for the preceding k−1 pages. Storing this redundant information gives the option of speeding up the construction of a logical page table 300 (FIG. 3), during power up, by accessing only a 1/k of the pages.

In FIG. 1, for example, every 4$^{th}$ control information includes control information for three previous pages: page control information 50(3) of the fourth page includes: logical page number (LPN0) 71(3) which is identical to LPN0 51(0), page sequence number (PSN0) 74(3) which is identical to PSN0 52(0), logical page number (LPN1) 72(3) which is identical to LPN1 51(1), page sequence number (PSN1) 75(3) which is identical to PSN1 52(1), logical page number (LPN2) 73(3) which is identical to LPN2 51(2) and page sequence number (PSN2) 76(3) which is identical to PSN2 52(2). Page sequence numbers 74, 75 and 76 are stored only if page sequence number 52 is implemented.

Figure 2:
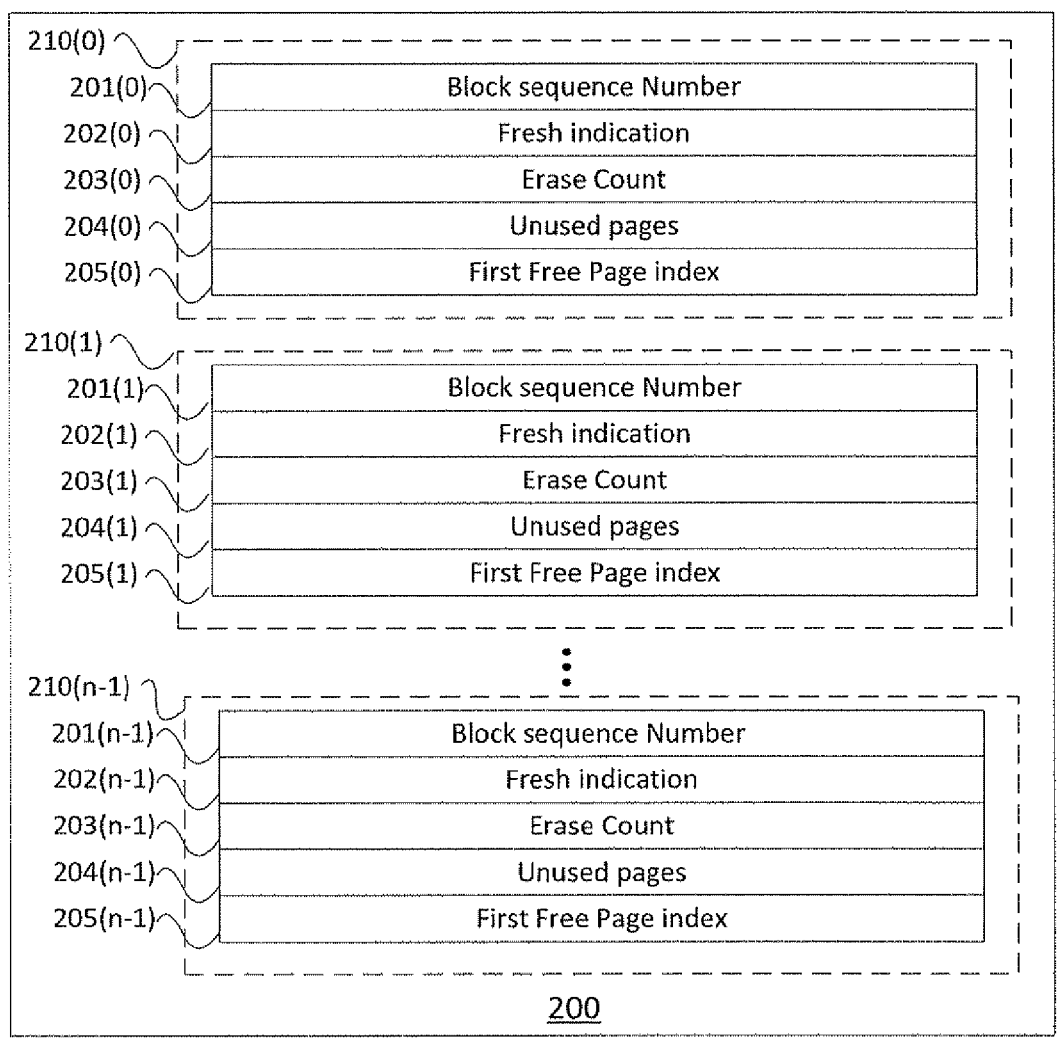
FIG. 2 is a block diagram, illustrating a block table, stored in a volatile memory of a controller, according to an embodiment of the invention.

FIG. 2 illustrates a block table (BT) 200, which is a volatile in-memory table, containing records, collectively denoted 210, for each of n blocks of the flash memory. Block table (BT) 200 is built upon power up and is stored in the controller's memory. Block table (BT) 200 is indexed by the physical block number (PBN), starting from 0 and up to n−1.

Each record 210 includes multiple fields, such as: a block sequence number 201, a fresh indication 202, an erase count 203, an unused page counter 204 and a first free page index 205. Block sequence number 201 is identical to block sequence number 53 that is written in page control information 50(0) (FIG. 1) and allows determining, when multiple physical pages have the same logical page number (LPN), which of the physical pages is more recent and therefore valid, and which is/are less recent and therefore superseded. Fresh indication 202 is used to distinguish fresh written blocks from blocks that experienced a reclamation process and include relocated pages. Erase count 203 is increased each time the block is erased and may be used by a wear leveling algorithm. Unused page number 204 includes the count of superseded pages as well as free pages. First free page index 205 points to the first page in the block that can be written and is set to the number of blocks per page (e.g. 64 or 128) if the block is completely written and has a zero value if the block is free and erased. In any other case, the block is partially written. Unused page number 204 may be used by the least blocks mode of the space reclamation.

Figure 3:
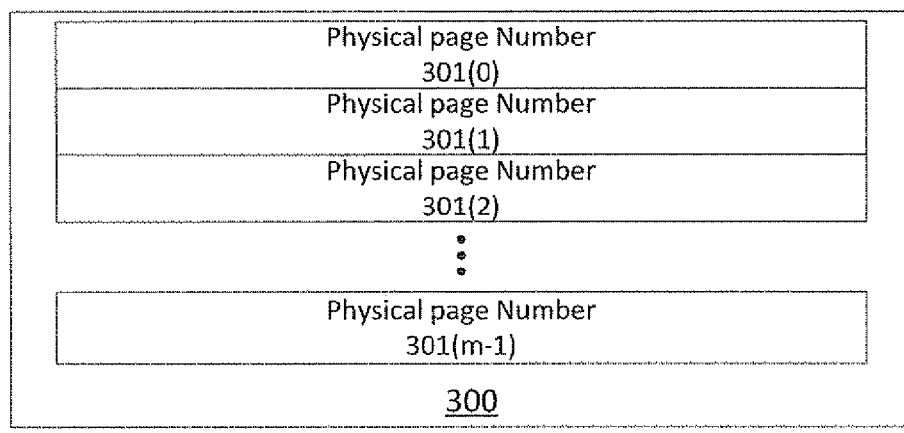
FIG. 3 is a block diagram, illustrating a logical page table, stored in a volatile memory of the controller, according to an embodiment of the invention.

FIG. 3 illustrates a logical page table (LPT) 300, which is a volatile in-memory table, indexed by the logical page number (LPN), and that serves as a lookup table for translating logical pages into their current physical page. Logical page table 300 includes m entries, wherein m is the total number of pages in the flash memory. Each entry i includes a physical page number 301(i), which is the currently written page, associated with logical page number i. For example, the first entry includes a physical page number 301(0) associated with the first logical page of the flash memory while the last entry includes a physical page number 301(m−1) associated with the last logical page, m−1, of the flash memory. A free page has value −1 (hex FFFFFFFF) in this field. During power-on, logical page table 300 is constructed by scanning of all logical page numbers 51 included in control information 50 of all the physical pages. The physical page number (PPN) combines the physical block number (PBN) with the offset of the page within the block, as follows:

PPN=PBN×PagesPerBlock+PageOffsetInBlock. For example: the number of the fifth page on the eleventh block, wherein each block contains 64 pages:

64*(11−1)+(5−1)=644 (the index of the first block and first page is zero).

Optionally, each entry of table 300 may include update information, e.g. page writing statistics to be used for estimating the page's update frequency, in case the frequency segregation is in force. Non limiting examples of statistics include: (i) page sequence number 52 that can be copied from control information 50 during power up; (ii) last x sequence numbers that were assigned to the page. This parameter may be used to calculate a recent average of "time" between successive writings, wherein "time" is actually the total number of I/O operations that occurred in the flash memory between successive writings to the specific page; (iii) The number of physical pages that currently hold a superseded version of the page. Any of these statistics may be compared to a corresponding global average of the flash memory in order to indicate whether the page is above or below the average. Any of the statistics may be backed up in control information 50 of the page.

A write pointer, also referred to as a write point (WP) is the physical page number at which the next fresh writing will take place. The write pointer points to one of the pages of a write block (WB). Each page writing advances the WP by 1, to the next page. When the write pointer exceeds the end of the WB, a new block with free pages is assigned to be the WB, and WP is set to point the first free physical page number (PPN) of the new WB. When frequency segregation is in force, several write pointers exist, each located on a different write block. Each fresh page is written to one of the WP's, according to the page's estimated update frequency.

Figure 4:
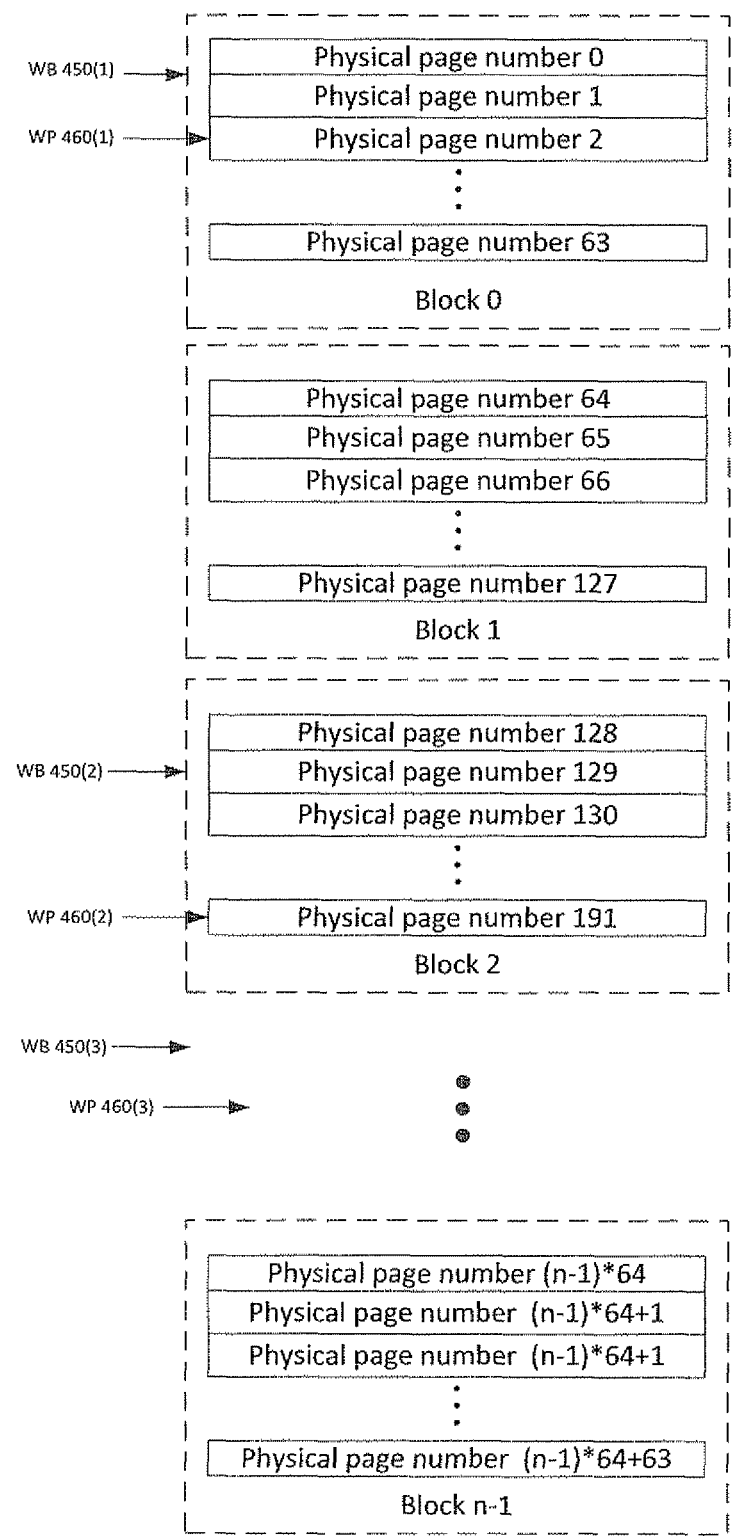
FIG. 4 is a block diagram, illustrating a memory map of blocks, pages and write pointers, according to an embodiment of the invention.

FIG. 4 illustrates n blocks of the flash memory, each block contains 64 pages: block number 0 contains page numbers 0-63, block number 1 contains page numbers 64-127, and so on, the last block n−1 contains pages number: (n−1)*64 to (n−1)*64+63. There are three write pointers in this example, WP 460(1), 460(2) and 460(3), each WP 460 points to a different page in different write blocks 450(1), 450(2) and 450(3), respectively. Each WP 460 is associated with a different update frequency. If frequency segregation is not in force, then only one WP 460 exists.

The controller keeps track of the number of free blocks on the flash device, and takes actions to insure that this number be at least as large as a predefined minimal free blocks threshold, d, for example d≥2. If the number of free blocks drops below the minimal free blocks threshold, then the space reclamation process takes place.

Figure 5:
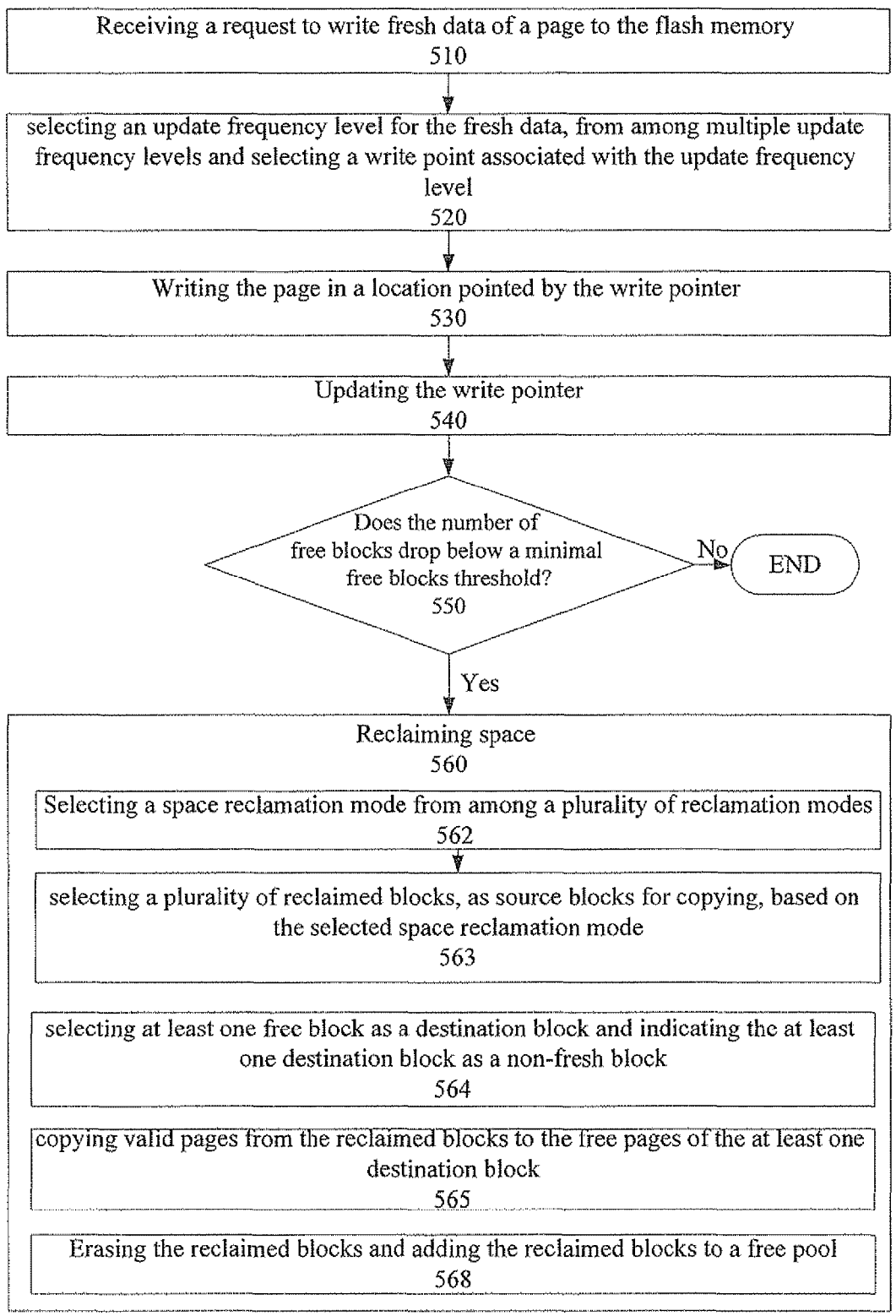
FIG. 5 is a flowchart illustrating a method for writing and maintaining data of a flash memory, according to an embodiment of the invention.

FIG. 5 illustrates a flowchart of a method 500 for managing writing to a flash memory. Method 500 includes writing fresh data to blocks of the flash memory and performing space reclamation that includes relocating other data that was previously written to the flash memory, to other blocks of the flash memory, such that the fresh data and the relocated data always are maintained in separate blocks of the flash memory. More details of method 500 are specified in pseudo code in appendix A.

Method 500 starts with a stage 510 of receiving a request to write fresh data of a page to the flash memory. The request is received from an application that utilizes the flash memory.

Stage 510 is followed by an optional stage 520 of selecting an update frequency level for the fresh data, from among multiple update frequency levels and selecting a write pointer associated with the update frequency level. The write pointer includes a write block pointer and an index of a next free page within the write block. Optionally, there are multiple write pointers, each of the write pointers points to a writing location, designated for writing pages of a certain update frequency level. Stage 520 is executed only when frequency segregation is in force.

The determination of the update frequency level of the page may be based on a fresh indication of a block that includes the page. The fresh indication of the block indicates that the block is fresh when the pages in the blocks were exclusively written in response to the request received from the application, on stage 510. The fresh indication of the block indicates the block is not fresh when the pages in the block were written by the space reclamation process. The update frequency level may be set to a cold update frequency level when the fresh indication of the block indicates a non-fresh block and set to a hot update frequency level when the fresh indication of the block indicates a fresh block.

Optionally, the determination of the update frequency level may further segregate fresh pages into multiple different levels of update frequencies, rather than just distinguishing fresh pages from relocated cold pages. The update frequency level of the page may be based on update information, such as a time stamp of the last page writing, that may be indicated by the page sequence number, if implemented. The determination of the update frequency level may be based on a difference between the global sequence number and the page sequence number. The difference is indicative of the number of writings that occurred in the flash memory since the specific page was most recently written. This difference may be compared to an average 'difference between writings' of a page that may be managed by the memory controller.

The determination of the update frequency level may be further based on a recent history of the page updates, e.g. an average time between successive writings of the page (or the average between several sequence numbers that were recorded for the page), a total number of writings of the page, an amount of superseded pages currently associated with the page and any other update statistics indicative of the page activity. In case the recent history of the page is used for the determination of the update frequency level, further statistics are stored in logical page table 300 and in control information 50.

Stage 520 is followed by a stage 530 of writing the page in a location pointed by the write pointer. If frequency segregation is not active, in which case stage 520 is not executed, then stage 510 is followed by stage 530 and stage 530 uses the only write pointer that exists. Stage 530 is further specified in more detail in FIG. 5A.

Stage 530 is followed by a stage 540 of updating the write pointer as for preparing to a subsequent write request. Stage 540 is specified in more detail in FIG. 5B and may involve decreasing the number of free blocks in case the current write block is full.

Stage 540 is followed by a stage 550 of checking whether the number of free blocks drops below a threshold of minimal number of free blocks. If the answer is 'yes', then stage 550 is followed by a stage 560. If the answer is 'no', the method ends.

Stage 560 includes reclaiming space of at least one full block, such that the number of free blocks, after the reclaiming stage, is increased by at least one full block compared to the number of free blocks before the reclaiming. Stage 560 includes reorganizing valid pages that reside on a set of source blocks into a set of destination blocks, so that the valid pages fit on at least one fewer block than in the source set. Blocks gained are erased and added to the free block pool.

It should be noted that stages 550 and 560 may be stages in a background process that execute in parallel with stages 510-540, rather than following stage 540. The following are detailed stages within stage 560.

Stage 560 includes a stage 562 of selecting a space reclamation mode from among a plurality of space reclamation modes. The space reclamation mode may be an age mode or a least blocks mode. The selection of the space reclamation mode is based on respective predefined probabilities for selecting the space reclamation modes and may be based on a predefined frequency threshold assigned to at least one of the modes. For example: the frequency of the age mode may be selected to be 10%-20%, in which case, on average, the age mode is selected after 8-9 times that the least blocks mode has been selected. The space reclamation mode may be set at random, with age mode occurring a fraction r of activations ($0<r<1$), so that the selection of the mode includes generating a random number, between 0 and 1, according to a uniform distribution and comparing the random number to the predefined frequency threshold, e.g. 0.1.

Stage 562 is followed by a stage 563 of selecting a plurality of reclaimed blocks, as source blocks for copying, based on the selected space reclamation mode. Stage 563 includes selecting blocks whose unused pages are only superseded pages and not free pages, i.e. the selected reclaimed blocks should conform to the rules: (i) blocks that includes no free pages, i.e. the first free page field is equal to the number of pages per block; and (ii) blocks that include at least one superseded page, i.e. the number of unused pages is not zero.

In case the age mode was selected, stage 563 includes selecting blocks that were least recently written with fresh data (e.g. the oldest blocks) and that further conforms to the above rules (should not include free pages and includes at least one superseded page). The oldest blocks may be selected as the blocks with the lowest sequence numbers among sequence numbers of all the other blocks. It should be noted that the oldest blocks are selected regardless of the number of their unused pages, so that even blocks that contain one superseded page can be selected. Additionally or alternatively, the selected blocks are blocks that were not freshly written during a time period that is longer than an inactivity duration threshold.

In case the least-blocks mode was selected, stage 563 includes selecting the blocks with fewest valid pages among all the blocks.

Stage 564 includes selecting at least one free block as a destination block and indicating the at least one destination block as a non-fresh block. Alternatively, stage 564 may includes selecting a non free block such that at least part of its pages are free, as long as the block is not fresh and does not include fresh pages.

Stage 565 includes copying valid pages from the reclaimed blocks to the free pages of the at least one destination block.

Stage 566 includes erasing the reclaimed blocks and adding the reclaimed blocks to a free block pool, once all the valid pages of the reclaimed blocks are copied to the destination block.

Stages 563-568 are performed in an iterative manner (as described in more details in appendix A, algorithm number 6), until the number of free blocks is larger than the number of blocks that were free before the method started. It is noted that in order to fulfill this rule, more than one reclaimed block should be selected, i.e. more than one iteration of the stages of the reclamation is performed. Additionally and optionally, stages 563-568 may be further repeated until the destination block is full of pages that were moved from reclaimed blocks. Keeping destination blocks, which are non-fresh blocks, completely full, eliminates any possibility of selecting non-fresh blocks as the writing blocks (WB) of fresh data and thus eliminates mixing cold pages and hot pages on the same page.

Figure 5A:
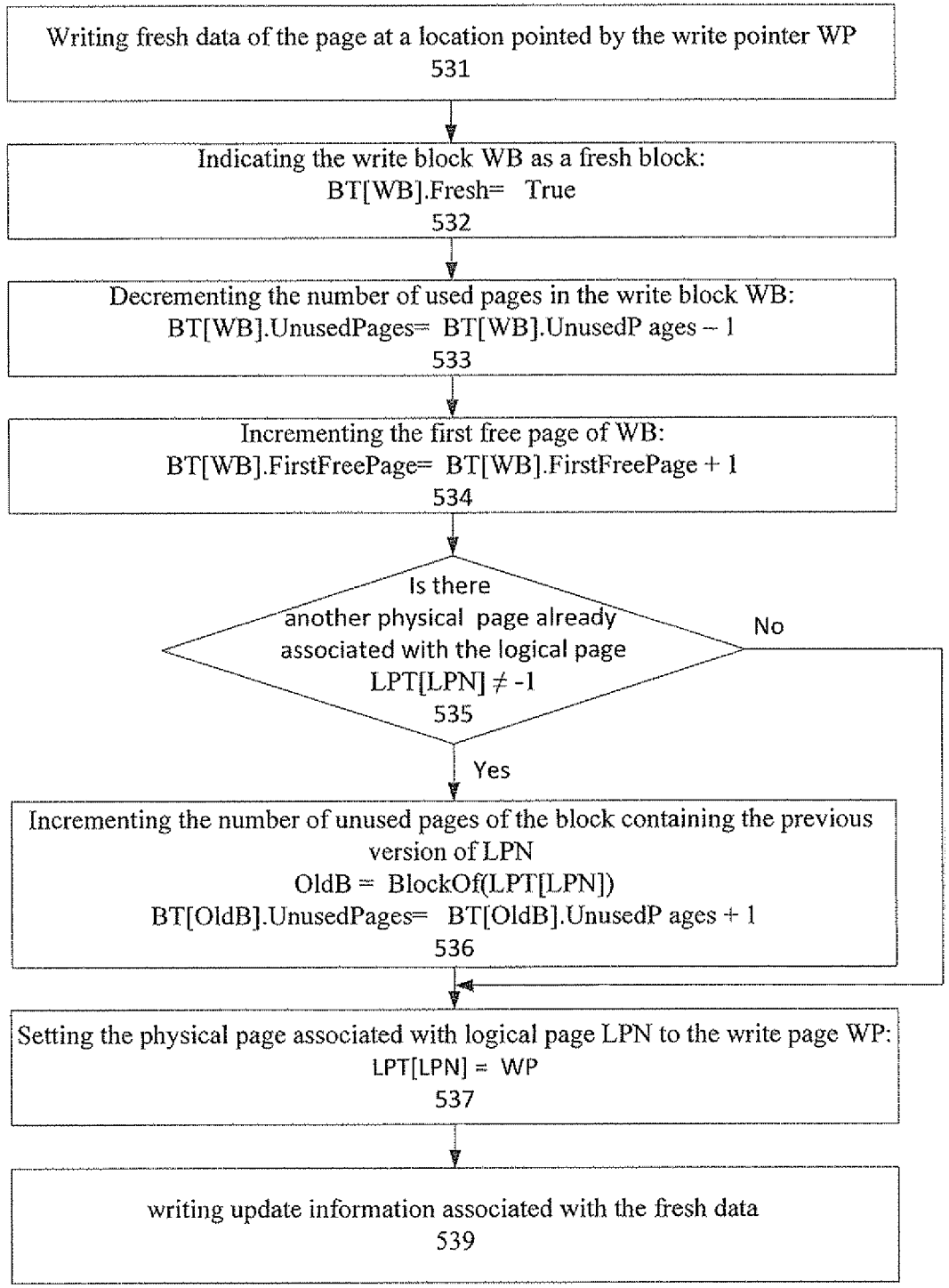
FIG. 5A is a flowchart illustrating further stages of writing a page, included in the method for writing and maintaining data of a flash memory, according to an embodiment of the invention.

FIG. 5A illustrates sub stages of stage 530 for writing the page: A stage 531 includes writing fresh data of the page at a location pointed by the write pointer WP.

Stage 531 is followed by a stage 532 of indicating the write block WB as a fresh block by assigning a value of 'true' in the fresh indication field of the block WB entry in block table 200.

Stage 532 is followed by a stage 533 of decrementing the number of unused pages in the write block WB, by decrementing the field 'unused pages' in the WB entry in block table 200.

Stage 533 is followed by a stage 534 of incrementing the first free page pointer of the write block WB, by incrementing the field 'first free page' in the WB entry in block table 200.

Stage 534 is followed by a stage 535 of checking whether another physical page is already associated with the logical page. If the entry of the page in logical page table 300 is different from minus one, then a physical page already exists and stage 535 is followed by a stage 536. Otherwise, stage 535 is followed by stage 537.

Stage 536 includes incrementing the number of unused pages of a block containing the other physical page (with an older version) of the logical page.

Stage 536 is followed by a stage 537 of setting the physical page, associated with logical page in logical table 300, to the write page WP.

Stage 537 is followed by an optional stage 539 of writing update information associated with the fresh data. The update information may include a page sequence number that is written in the spare area of the physical page and may be further stored in logical page table 300. The update information may include any other update statistics and information indicative of the age of the data.

Figure 5B:
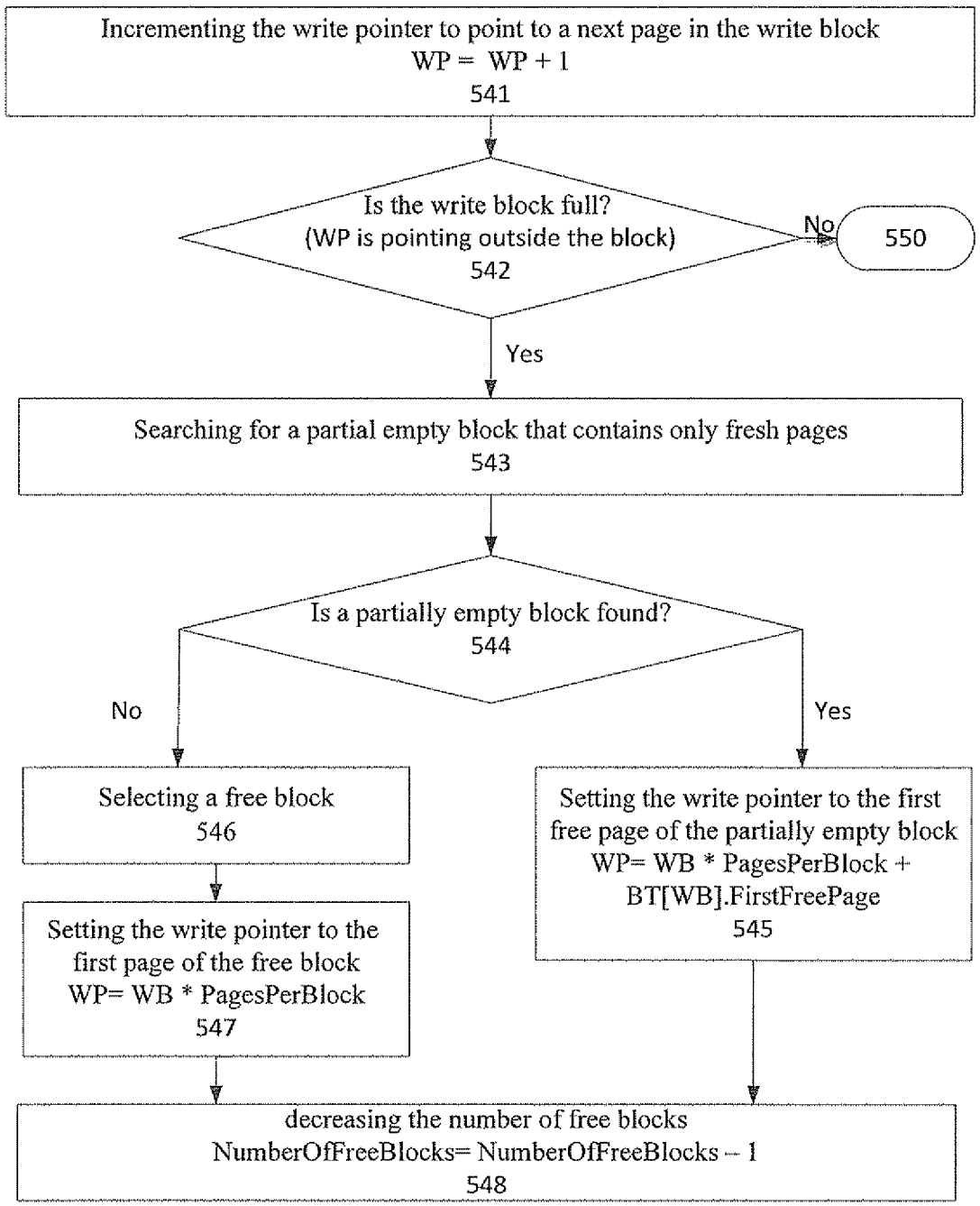
FIG. 5B is a flowchart illustrating further stages of updating a write pointer, included in the method for writing and maintaining data of a flash memory, according to an embodiment of the invention.

FIG. 5B illustrates sub stages of stage 540 for updating the write pointer. Stage 541 includes incrementing the write pointer as to point the next page in the write block.

Stage 541 is followed by a stage 542 of determining whether the write block is full. The determination may include checking that the incremented write pointer points to a block that is not the write block (i.e. the write pointer points outside the scope of the block).

If the block is full, then stage 541 is followed by a stage 543, otherwise, stage 541 is followed by stage 550 (FIG. 5). Stage 543 includes searching for a partial empty block that contains only fresh pages. Note that non-fresh blocks that include relocated pages are not selected, in order to avoid mixing of fresh pages and relocated pages in the same block.

If a partially empty block was found (stage 544) then the sequence follows a stage 545 of setting the write pointer to the first free page of the partially empty block.

If a partially empty block was not found, the sequence follows a stage 546 of selecting a free block, i.e. an erased block.

Stage 546 is followed by a stage 547 of setting the write pointer to the first page of the free block.

Stages 545 and 547 are followed by a stage 548 of decreasing the number of free blocks in the flash memory.

Figure 6A:
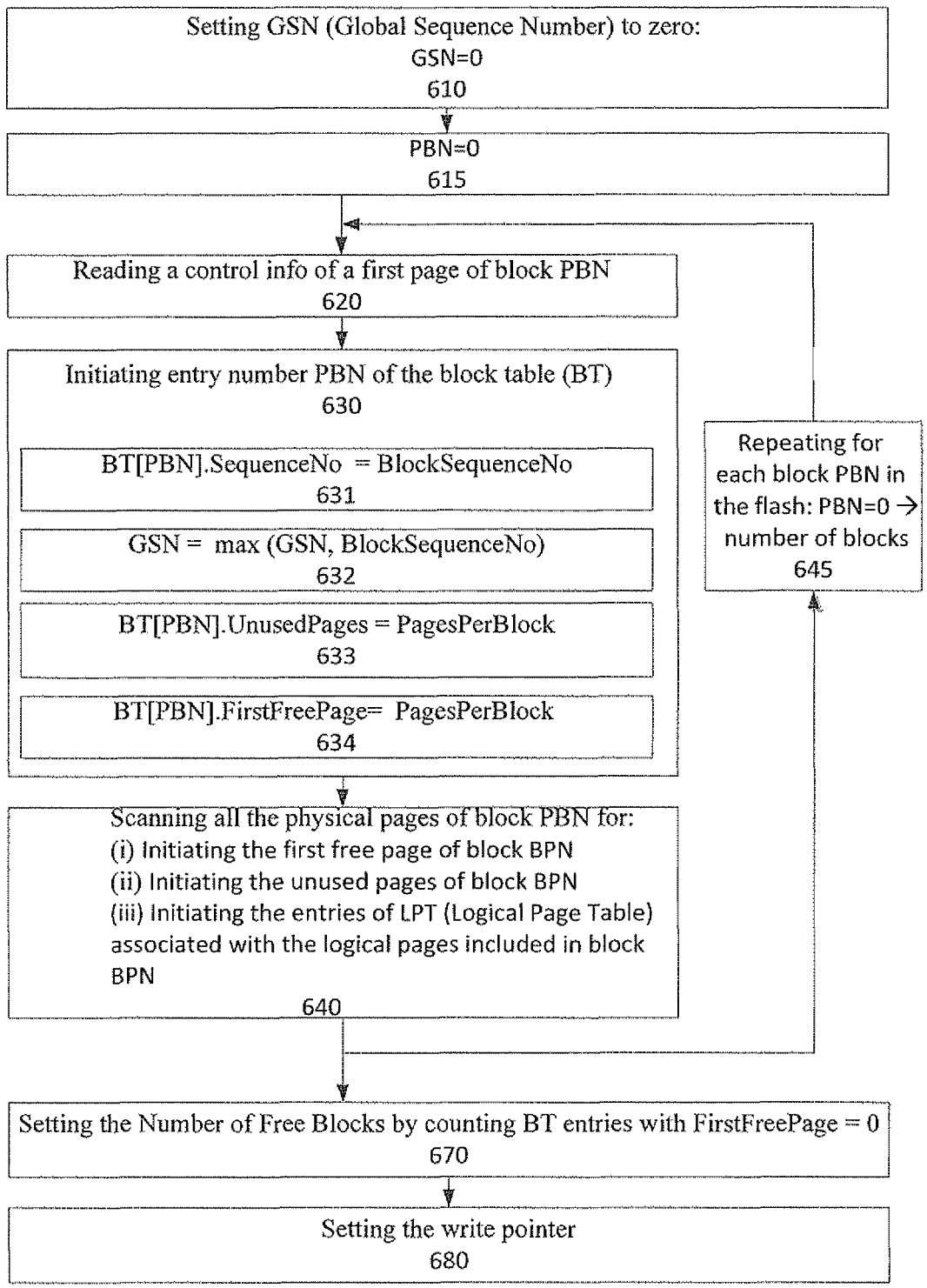
FIGS. 6A and 6B are flowcharts illustrating a method for initiating data structures upon power up, according to an embodiment of the invention.

FIG. 6A illustrates a flowchart of a method 600 for initializing data structures required by the flash memory controller for managing the flash device. Method 600 is triggered upon power up and includes scanning the flash device so as to build volatile structures and variables: the block table (BT), the logical page table (LPT) and global variables, such as: the global sequence number (GSN), number of free blocks and the write pointer(s). Essentially all sections of control information 50 must be accessed to achieve this purpose. This may be done by sequentially accessing each page in a physical order (i.e. by PPN order). A NAND flash memory requires a read delay of about 15 microseconds from accessing a page until its data may be serially read. Since flash media may contain millions of pages, this is a time-consuming operation. To expedite the procedure, method 600 resorts to the following resources: Each NAND chip may be accessed independently of other chips. The procedure may therefore scan all chips in parallel. As the page read delay of 15 microseconds is long compared to the CPU time required by the controller, the elapsed time of a parallel algorithm is about the elapsed time of scanning a single chip. Additionally, fields 71-76 (FIG. 1) of control information 50, which are written on every $4^{th}$ page in a block, allow method 600 to get the required information by reading only a quarter of the pages (in addition to the first page, which must always be accessed for block-specific information), thereby cutting the elapsed time for the procedure by a factor of almost 4. For brevity, method 600 will be described without the available shortcuts.

The initialization of the data structures includes: (i) setting a value of the global sequence number (GSN) as a highest sequence number among all blocks' sequence numbers and pages' sequence numbers (if implemented); (ii) obtaining details of all blocks of the flash memory, for building the block table, by reading control information 50 from the first page of each block that includes block sequence number 53 and by reading control information 50 of all the other pages of the block for calculating: a number of unused pages 204 and first free page index 205 of each block; (iii) determining a physical page associated with each logical page. A logical page may have several versions written to different physical pages. Only the newest version is valid and should be associated with the logical page. The newest version is the page with the highest sequence number; (iv) determining a number of free blocks by counting blocks whose first free page is zero; and (v) initiating at least one write pointer.

Referring back to FIG. 6A, a stage 610 includes setting the global sequence number to zero.

A stage 615 includes setting a loop variable BPN (block physical number) to zero. Stages 620-640 are repeated for each block BPN in the flash, as indicated box 645.

A stage 620 includes reading control information 50 of a first page of block PBN.

A stage 630 includes initiating entry number PBN of block table (BT) 200. Stage 630 includes stages 631-634. Stage 631 includes setting block sequence number 201 in the block table to block sequence number 53 read from control information 50 of the first page. Stage 632 includes adjusting the global sequence number so as to hold the largest sequence number between the current GSN and block sequence number 201 of PBN. Stage 633 includes setting unused pages 204 to the maximum number of pages per block. Stage 634 includes setting first free page index 205 of the block to indicate that no page is available (i.e. setting to maximum number of pages per block).

A stage 640 includes scanning all the physical pages of block PBN for: (i) Initiating the first free page of block BPN; (ii) Initiating the unused pages of block BPN; and (iii) Initiating the entries of LPT (Logical Page Table) associated with the logical pages included in block BPN. Stage 640 is specified in FIG. 6B that illustrates the scanning of the physical pages of the block PBN.

Figure 6B:
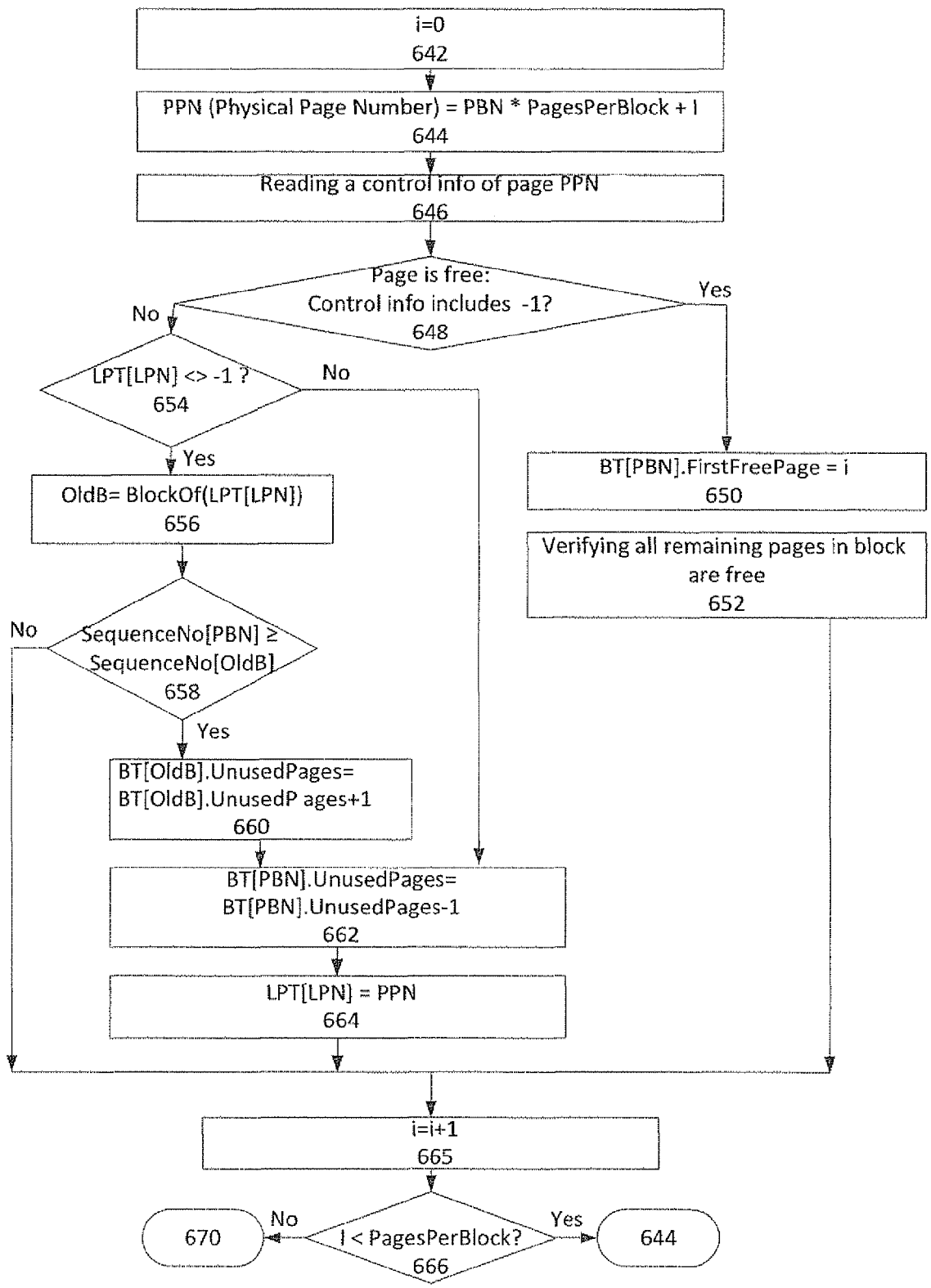

Stage 642, in FIG. 6B includes setting a loop variable, i, to zero. Variable i holds the current page index of the block.

Stage 644 includes calculating the physical page number, PPN, according to the PBN (the current physical block number), i (the current page index) and the maximum pages in a block.

Stage 646 includes reading the control information of the physical page PPN.

Stage 648 includes checking if the physical page is free. A free page is indicated by having all 1's as content. If the page is free, then stage 648 is followed by a stage 650, otherwise stage 648 is followed by a stage 654.

Stage 650 includes setting the first free page, in the entry of block PBN at the block table, to the index of the page i.

Stage 652 includes verifying that all remaining pages in block PBN are free.

Stage 654 includes checking if another version of the logical page exists. The checking is done by reading the entry of the logical page in the logical page table and checking if it is not empty. The LPN (logical page number) associated with the page was read from the control information of the page.

If there is no other version for the logical page, then stage 654 is followed by a stage 662; if there is another version, as indicated in the logical page table, then stage 654 is followed by a stage 656.

Stage 656 includes obtaining the number of the block associated with a physical page that is currently assigned to the logical page LPN.

Stage 658 includes checking which of the two versions is newer. The checking includes comparing the sequence numbers of the current treated block PBN to the sequence number of the block number obtained in stage 656. If block PBN is older, then block PBN is not updated with the details of the current handled page and stage 658 is followed by stage 665, otherwise stage 658 is followed by a stage 660.

Stage 660 includes incrementing the number of unused pages of the block number that was obtained in stage 656.

Stage 660 is followed by a stage 662 of decrementing the unused pages in block PBN.

Stage 662 is followed by a stage 664 of assigning the physical page number PPN to the entry of the logical page number LPN, in logical page table.

Stages 652, 658 and 664 are followed by a stage 665 of incrementing the page index, i.

Stage 665 is followed by a stage 666 of checking if there are more pages in the block and if so, stage 666 is followed by stage 644, otherwise, stage 665 is followed by stage 670 (FIG. 6A), if all the blocks were scanned or by stage 620, if there are more blocks to scan.

Stage 670 includes setting the number of free blocks by counting the entries in the block table that contains a zero value in the field of first free page pointer.

Stage 670 is followed by a stage 680 of setting the write pointer. Stage 680 includes stages 543-548 of FIG. 5B.

Figure 7:
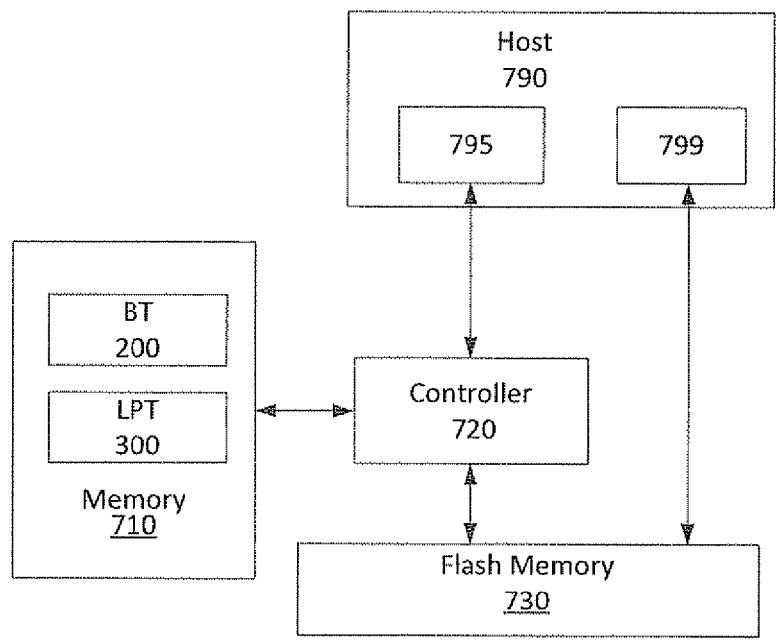
FIG. 7 is a schematic block diagram illustrating a memory controller, according to an embodiment of the invention.

FIG. 7 illustrates a memory controller 720 coupled to a flash memory 730 and to a host 790. Flash memory 730 is a NAND flash memory, organized in m physical pages, wherein each page is a basic write unit. Flash memory 730 includes n blocks, as a basic erase unit, wherein each block includes k pages (k is typically 64 or 128 or any other number used in practice for pages in a block). Memory controller 720 is configured to perform method 500 for managing writing to flash memory 730 and method 600 for initializing data structures required for managing flash memory 730.

Host 790 may be any computerized system that requires access to flash memory 730. Access is requested by applications, such as an application 795, running on host 790. According to a preferred embodiment, host 790 sends read and write requests to memory controller 720. According to another embodiment, host 790 is coupled to flash memory 730 and includes a dedicated application 799 for implementing methods 500 and 600 and drivers for accessing flash memory 730.

Figure 8:
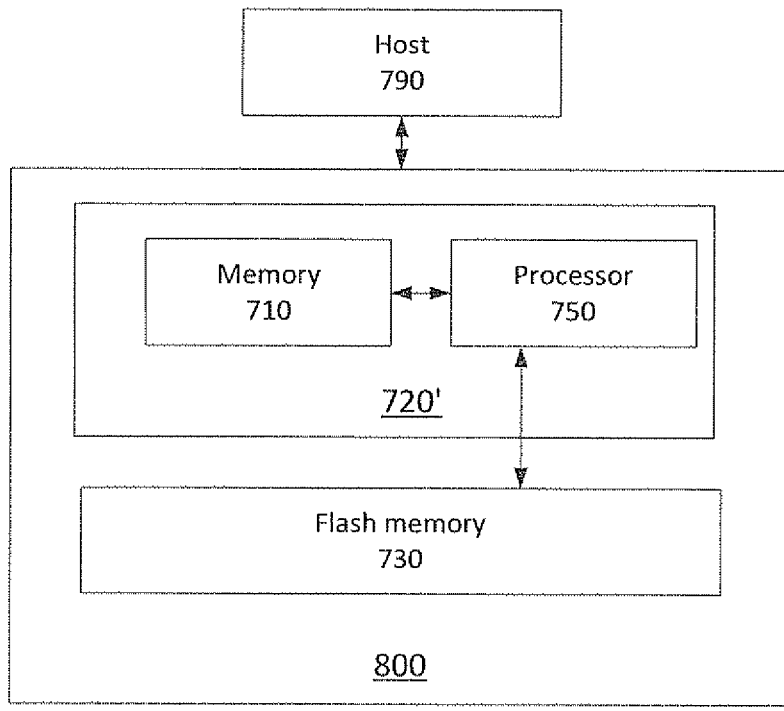
FIG. 8 is a schematic block diagram illustrating a flash device, according to another embodiment of the invention.

Memory controller 720 is coupled to a volatile memory 710 for storing block table 200, logical page table 300 and global variables, such as: global sequence number, number of free blocks and write pointers. Alternatively, controller 720 may include memory 710, as illustrated in FIG. 8. Memory 710 may be any type of volatile memory, such as a random access memory (RAM): a static RAM (SRAM), dynamic RAM (DRAM) and the like.

Memory controller 720 is configured to manage data structures required to manage flash memory 730, such as block table 200, logical page table 300 and other global variables.

FIG. 8 illustrates a memory device 800 that includes flash memory 730, a memory controller 720' that is different from memory controller 720 by including memory 710 rather than been coupled to memory 710. Both memory controllers 720 and 720' include at least one processor 750 and may be integrated circuits.

While the purpose of this invention is improving write speed, no flash algorithm is exempt from considering wear leveling, the balancing of write/erase operations over physical blocks to insure a near-optimal lifetime of the media. The methods of the invention, as described, are generally supportive of this goal. In particular, the age mode of space reclamation insures that most physical blocks will not remain idle indefinitely. However, an exception occurs for a block containing static data with no superseded pages. Such a block will not be selected for moving by age mode, or by any other mode. Therefore supplementary steps should be taken by an algorithm to ensure static wear leveling. A simple algorithm to achieve this is to periodically select the oldest block on the media and move its data to a free block. At low frequencies such an algorithm will be effective yet not impact performance much.

The write performance of the flash device, in comparison to a reference log-structured system was measured using a simulator. The simulator included a software implementation of both the flash device and the log-structured system, with timing of flash operations taken according to typical values given by NAND vendor specifications. Performance was measured on both 1-bit per cell (SLC) flash and 2-bit per cell (MLC) NAND flash. The starting point for all performance measurements was the writing of all logical pages to a newly formatted media, so that the logical media was 100% full throughout the measurement. A stream of data pages was generated for writing, based on several options and parameters: a percentage of static data between 0% and 99% determined which part of the media is static. The required percentage was randomly selected from all logical pages, and these pages were declared static: i.e. after the initial write they were never written again. The uniform fresh distribution selects a write-stream of pages with all non-static pages having equal frequency. Alternatively, 80/20 fresh distribution selects a write-stream of pages using a power law, with 20% of the non-static pages occurring 80% of the time. The number of sequential pages per write determines how many logical sequential pages are written in each write. A value of 1 means random-write of pages. The over-allocation percentage is a parameter of the simulator. The simulator implemented methods as described, with minimum number of free blocks d set to 1. Frequency segregation was not used. Additionally, static wear leveling was implemented. The average write speeds and write amplifications under various scenarios were measured. The results are set forth in Tables 1 and 2.

TABLE 1

| | | | | | | | | |
|---|---|---|---|---|---|---|---|---|
| Over-provisioning | Static data | Fresh distribution | Sequential blocks per write | Prior art Log write speed (KB/sec.) | Prior art Log write amplication | write speed (KB/sec.) of the invention | write amplicati of the invention | Gain |
| 5% | 0% | Uniform | 1 | 1283 | 9.19 | 1229 | 9.59 | (4%) |
| 15% | 0% | Uniform | 1 | 3126 | 3.80 | 3080 | 3.85 | (1%) |
| 40% | 0% | Uniform | 1 | 6301 | 1.91 | 6264 | 1.92 | (1%) |
| 100% | 0% | Uniform | 1 | 9834 | 1.24 | 9818 | 1.24 | 0% |
| 15% | 33% | Uniform | 1 | 3067 | 3.87 | 3800 | 3.13 | 24% |
| 15% | 67% | Uniform | 1 | 2801 | 4.23 | 6434 | 1.87 | 130% |
| 15% | 0% | Uniform | 8 | 3589 | 2.31 | 3469 | 2.43 | (3%) |
| 15% | 0% | Uniform | 64 | 5283 | 2.27 | 7640 | 1.58 | 45% |
| 5% | 0% | 80/20 | 1 | 988 | 11.91 | 1491 | 7.91 | 51% |
| 15% | 0% | 80/20 | 1 | 2303 | 5.14 | 3330 | 3.57 | 45% |
| 40% | 0% | 80/20 | 1 | 4639 | 2.57 | 6130 | 1.96 | 32% |
| 100% | 0% | 80/20 | 1 | 7661 | 1.58 | 8856 | 1.37 | 16% |
| 15% | 33% | 80/20 | 1 | 2256 | 5.25 | 3778 | 3.15 | 67% |
| 15% | 67% | 80/20 | 1 | 2188 | 5.41 | 5361 | 2.23 | 145% |
| 15% | 0% | 80/20 | 8 | 2844 | 4.17 | 3694 | 3.22 | 30% |
| 15% | 0% | 80/20 | 64 | 4366 | 2.73 | 8800 | 1.38 | 102% |

TABLE 2

Write speed of MLC (2 bit/cell) NAND flash

| Over-provisioning | Static data | Fresh distribution | Sequential blocks per write | Log write speed (KB/sec.) | Log write amplication | write speed (KB/sec.) of the invention | write amplicati of the invention | Gain |
|---|---|---|---|---|---|---|---|---|
| 5% | 0% | Uniform | 1 | 424 | 9.74 | 414 | 9.96 | (2%) |
| 15% | 0% | Uniform | 1 | 1079 | 3.87 | 1067 | 3.91 | (1%) |
| 40% | 0% | Uniform | 1 | 2207 | 1.92 | 2196 | 1.93 | 0% |
| 100% | 0% | Uniform | 1 | 3480 | 1.24 | 3475 | 1.24 | 0% |
| 15% | 33% | Uniform | 1 | 1050 | 3.97 | 1366 | 3.07 | 30% |
| 15% | 67% | Uniform | 1 | 966 | 4.31 | 2235 | 1.90 | 131% |
| 15% | 0% | Uniform | 8 | 1163 | 3.59 | 1137 | 3.67 | (2%) |
| 15% | 0% | Uniform | 64 | 1636 | 2.57 | 1682 | 2.50 | 3% |
| 5% | 0% | 80/20 | 1 | 321 | 12.85 | 512 | 8.07 | 60% |
| 15% | 0% | 80/20 | 1 | 785 | 5.29 | 1149 | 3.63 | 46% |
| 40% | 0% | 80/20 | 1 | 1615 | 2.60 | 2130 | 1.99 | 32% |
| 100% | 0% | 80/20 | 1 | 2707 | 1.58 | 3132 | 1.37 | 16% |
| 15% | 33% | 80/20 | 1 | 766 | 5.42 | 1288 | 3.25 | 68% |
| 15% | 67% | 80/20 | 1 | 738 | 5.62 | 1870 | 2.26 | 153% |
| 15% | 0% | 80/20 | 8 | 886 | 4.70 | 1208 | 3.46 | 36% |
| 15% | 0% | 80/20 | 64 | 1362 | 3.07 | 1837 | 2.30 | 35% |

While the invention has been described with respect to a limited number of embodiments, it will be appreciated that many variations, modifications and other applications of the invention may be made. Therefore, the claimed invention as recited in the claims that follow is not limited to the embodiments described herein.

APPENDIX A

The appendix includes the pseudo code for each of the algorithms in the invention: power on, page writing and reading, space reclamation and supplementary algorithms.

Algorithm 1 PowerOn

```
1: procedure PowerOn
2:     GSN = 0
3:     Initialize all LPT entries to −1
4:     for PBN = 0 to NumberOfBlocks − 1                    *** loop over all blocks
5:         Read block PBN's first page control info
6:         BT[PBN].SequenceNo = BlockSequenceNo
7:         GSN = max (GSN, BlockSequenceNo)
8:         BT[PBN].UnusedPages = PagesPerBlock              *** initialize all pages unused
9:         BT[PBN].FirstFreePage = PagesPerBlock            *** no free page found yet
10:        for i = 0 to PagesPerBlock − 1                   *** loop over all pages in block
11:            PPN = PBN * PagesPerBlock + i
12:            Read block PBN's i'th page control info
13:            if LPN = −1 then
14:                BT[PBN].FirstFreePage = i                *** page is free
15:                Verify all remaining pages in block are free
16:                Go to 31                                 *** continue at next block
17:            else
18:                if LPT[LPN] <> −1 then *** LPN is written elsewhere
19:                    OldB = BlockOf(LPT[LPN])    *** block where LPN is
                                                            Previously written
20:                    if SequenceNo[PBN] >= SequenceNo[OldB] then *** is current page
                                                                        more recent?
21:                        BT[OldB].UnusedPages = BT[OldB].UnusedPages+1 . *** yes
22:                        BT[PBN]:UnusedPages = BT[PBN].UnusedPages−1
23:                        LPT[LPN] = PPN
24:                    end if
25:                else
26:                    BT[PBN].UnusedPages = BT[PBN].UnusedPages−1
27:                    LPT[LPN] = PPN
28:                end if
29:            end if
30:        end for
31:    end for
32:    Set Number of Free Blocks by counting BT entries with FirstFreePage = 0.
33:    SetWritePoint
34: end procedure
```

Algorithm 2 SetWritePoint

```
1:    procedure SetWritePoint
2:        if A block WB exists such that 0 < BT[WB].FirstFreePage
              < PagesPerBlock
          then
3:            WP = WB * PagesPerBlock + BT[WB].FirstFreePage
```

-continued

```
4:         else
5:             WB = any free PBN
6:             WP = WB * PagesPerBlock
7:         end if
8:         BT[WB].Fresh= False        *** Until proven otherwise
9:     end procedure
```

Algorithm 3 PageRead

```
1: procedure PageRead(LPN)
2:     PPN = LPT[LPN]
3:     if PPN ≠ -1 then                *** is page written?
4:         Read and return data from physical page PPN
5:     else
6:         Return page of binary 0's   *** page is not written,
                                            returning arbitrary data
7:     end if
8: end procedure
```

Algorithm 4 PageWrite

```
1: procedure PageWrite(LPN)
2:     Frequency segregation: determine WP from    *** See algorithm 5
           LPN
3:     Write data to physical page WP
4:     WB = BlockOf(WP)
5:     BT[WB].Fresh= True
6:     BT[WB].UnusedPages= BT[WB].UnusedPages - 1
7:     BT[WB].FirstFreePage= BT[WB].FirstFreePage + 1
8:     if LPT[LPN] ≠ -1 then
9:         OldB = BlockOf(LPT[LPN])
10:        BT[OldB].UnusedPages= BT[OldB].UnusedPages + 1
11:    end if
12:    LPT[LPN] = WP
13:    WP = WP + 1
14:    if WB ≠ BlockOf(WP) then        *** Write Point passed
                                            end of block
15:        SetWritePoint
16:        NumberOfFreeBlocks= NumberOfFreeBlocks - 1
17:        if NumberOfFreeBlocks < d then
18:            SpaceReclamation
19:        end if
20:    end if
21: end procedure
```

Algorithm 5 FrequencySegregation

```
1: function FrequencySegregation(LPN)
2:     if frequency segregation not active then
3:         return WP                    *** There's only one WP in this
                                             case
4:     else
5:         PPN = LPT[LPN]
6:         if PPN = -1 then             *** Page not already written, assume
                                             cold page
7:             return ColdWP
8:         else if Not BT[BlockOf(PPN)].Fresh then
9:             return ColdWP
10:        else
11:            return HotWP
12:        end if
13:    end if
14: end function
```

Algorithm 6 SpaceReclamation

```
procedure SpaceReclamation
 2:    R = random number uniformly selected from 0 to 1
 3:    TB = any free block
 4:    if R < r then
 5:        SB = SelectOldestBlock( )                *** age mode
 6:    else
 7:        SB = SelectBlockWithLeastValidPages( )   *** least-blocks mode
 8:    end if
 9:    Move all (remaining) valid pages from SB to TB   *** using IsPageValid
10:    Erase SB and add to free block pool
11:    if TB is free then
12:        return
13:    end if
14:    FirstConditionMet = False
15:    loop
16:        if R < r then
17:            SB = SelectOldestBlock( )            *** age mode
18:        else
19:            SB = SelectBlockWithLeastValidPages( )   *** least-blocks mode
20:        end if
21:        if number of valid pages on SB > number of free pages on TB then
22:            Move valid pages from SB to TB until TB is full    *** using
                                                                      isPageValid
23:            if FirstConditionMet then
24:                return
25:            end if
26:            TB = any free block
27:        else
28:            FirstConditionMet = True
29:        end if
30:        Move all (remaining) valid pages from SB to TB    *** using
                                                                  IsPageValid
31:        Erase SB and add to free block pool
32:        if FirstConditionMet and (TB is full or TB is completely free) then
33:            return
34:        end if
35:    end loop
36: end procedure
```

Algorithm 7 IsPageValid

```
1: function IsPageValid(PPN)
2:     Read LPN from page PPN's page control info
3:     if LPT[LPN] = PPN then
4:         return True        *** page is valid
5:     else
6:         return False       *** page is superseded
7:     end if
8: end function
```

Algorithm 8 SelectBlockWithLeastValidPages

Scan BT[ ] to find a block satisfying the following conditions:
  (i) No free pages, i.e. the FirstFreePage field is equal to PagesPerBlock.
  (ii) At least one superseded page, i.e. the UnusedPages field is not positive.
  (iii) Least valid pages, i.e. the block with highest UnusedPages field.

Algorithm 9 SelectOldestBlock

Scan BT[ ] to find a block satisfying the following conditions:
  (i) No free pages, i.e. the FirstFreePage field is equal to PagesPerBlock.
  (ii) At least one superseded page, i.e. the UnusedPages field is not positive.
  (iii) Oldest data, i.e. the block with least SequenceNo Field.

What is claimed is:

1. A method for storing fresh data in a flash memory, comprising:
   selecting an update frequency level for the fresh data from among multiple update frequency levels; and
   writing the fresh data to a block that is associated with the selected update frequency level;
   wherein the writing of fresh data includes writing update information indicative of an age of the fresh data;
   and wherein the update information includes a page sequence number;
   and wherein the selected update frequency level is based on a difference between a global sequence number and the page sequence number.

2. The method of claim 1, wherein, if a previous version of the fresh data was freshly written, a hot update frequency level is selected.

3. The method of claim 1, wherein, if a previous version of the fresh data was written during space reclamation, a cold update frequency level is selected.

4. The method of claim 1, wherein, if a block associated with a previous version of the fresh data is indicated as a fresh block, a hot update frequency level is selected.

5. The method of claim 1, wherein, if a block associated with a previous version of the fresh data is indicated as a non-fresh block, a cold update frequency level is selected.

6. The method of claim 1, wherein the selecting of the update frequency level is based on the update information.

7. A memory controller, coupled to a flash memory, configured to:
   select an update frequency level for fresh data from among multiple update frequency levels; and
   write the fresh data to a block that is associated with the selected update frequency level;
   wherein the memory controller is configured to write update information indicative of an age of the fresh data;
   and wherein the update information includes a page sequence number;
   and wherein the memory controller is configured to select the update frequency level based on a difference between a global sequence number and the page sequence number.

8. The memory controller according to claim 7, wherein, the memory controller is configured to select a hot update frequency level, if a previous version of the fresh data was freshly written.

9. The memory controller according to claim 7, wherein, the memory controller is configured to select a cold update frequency level, if a previous version of the fresh data was written during space reclamation.

10. The memory controller according to claim 7, wherein, the memory controller is configured to select a hot update frequency level, if a block associated with a previous version of the fresh data is indicated as a fresh block.

11. The memory controller according to claim 7, wherein, the memory controller is configured to select a cold update frequency level, if a block associated with a previous version of the fresh data is indicated as a non-fresh block.

12. The memory controller according to claim 7, wherein the memory controller is configured to select the update frequency level, based on the update information.

* * * * *